United States Patent [19]

Rabinowitz

[11] Patent Number: 4,774,493
[45] Date of Patent: Sep. 27, 1988

[54] METHOD AND APPARATUS FOR TRANSFERRING INFORMATION INTO ELECTRONIC SYSTEMS

[75] Inventor: David M. Rabinowitz, Corvallis, Oreg.

[73] Assignee: Hewlett-Packard Company, Palo Alto, Calif.

[21] Appl. No.: 863,673

[22] Filed: May 15, 1986

[51] Int. Cl.⁴ .................... H04M 11/04; G08B 21/00
[52] U.S. Cl. .................... 340/310 A; 340/310 R; 340/636; 340/657; 340/660; 340/825.44; 364/707; 368/203; 368/204
[58] Field of Search ............... 340/636, 657, 660–662, 340/663, 310 R, 310 A, 825.06, 825.15, 825.44, 514, 558; 364/184–187, 550, 580, 579, 707; 368/203, 204, 249, 251

[56] References Cited

U.S. PATENT DOCUMENTS

| | | | |
|---|---|---|---|
| 4,290,109 | 9/1981 | Taniguchi et al. | 340/636 |
| 4,438,431 | 3/1984 | Toyomura | 340/636 |
| 4,466,074 | 8/1984 | Jindrick et al. | 364/707 |
| 4,553,081 | 11/1985 | Koenck | 340/636 |

OTHER PUBLICATIONS

"Dynamic Digital Board Testing", Hewlett-Packard Application Note AN308-1, Nov. 1980.
Rhodes-Burke, "Retrofit for Signature Analysis Simplified", Hewlett-Packard Journal, p. 9, Jan. 1982.

*Primary Examiner*—Donnie L. Crosland
*Attorney, Agent, or Firm*—Bloor Redding, Jr.

[57] ABSTRACT

An apparatus and method are disclosed for transferring information into an integrated circuit over the power supply pins of the integrated circuit. The apparatus and method are used to load a test program into memory of the computer system and the system is caused to execute the test program to verify proper operation of the computer system. The apparatus and method are implemented by converting the information to be loaded into a serial bit stream, using the serial bit stream to modulate the power supply voltage of the computer system. Inside the computer system, the low power supply levels are sensed by a low power supply detection unit an fed to a serial-to-parallel converter where it is converted back into the original information.

12 Claims, 2 Drawing Sheets

METHOD AND APPARATUS FOR TRANSFERRING INFORMATION INTO ELECTRONIC SYSTEMS

BACKGROUND

1. Field of Invention

This invention relates to the field of data processing, and more particularly to a method for transferring data between electronic devices. The invention is especially adapted to testing systems comprising electronic devices, however, the invention is equally useful for transferring data into electronic devices under any condition.

2. Description of the Prior Art

Data processing systems typically consist of a central processing unit (CPU), RAM, ROM, and one or more input and output devices such as a keyboard and display. Great consumer interest has been generated in these system as their size has been reduced. The handheld personal calculator is but one example of the increased interest in small computing systems.

In order to reduce the size of these and similar systems, the industry has used increasing levels of integration to reduce both the size and number of integrated circuits employed in the system thereby combining many gates into a single integrated circuit and many integrated circuits into one or two integrated circuits. Today, the size of these integrated circuits is limited by the packaging and the need to get signals between each integrated circuit in the system. Each integrated circuit must have two power supply pins, one for the voltage supply line and one for the ground line. The definition of the remainder of the pins is determined by the designer. The selection of the definitions for the pins is a critical aspect in the design of any integrated circuit. For example, with a RAM or a ROM, unnecessary uses of pins can significantly reduce the amount of data that the RAM or ROM can access thereby driving up costs. Methods used to reduce the number of connection pins include multiplexing data and address busses and serializing the data to be transferred over the data and address busses.

Many modern consumer products are battery operated. Consumers usually prefer to be alerted that the batteries need replacement prior to the product failing rather than having for the power to fail during an important operation. Many modern consumer products monitor the voltage supply line and stop operation and notify the user when the batteries have passed their useful like. This is usually accomplished by making the system devices function properly with a wide variation in power supply voltage and then including a low power supply detection circuit which senses when the battery voltage has dropped below a particular level and then notifying the user accordingly.

Testing a device during its manufacture is necessary in order to provide reliable high quality products. However, testing the product does not necessarily enhance the marketability of a product, so it is not always desirable to dedicate a pin of an integrated circuit or program space in a ROM in order to test a product for manufacturing defects. Prior art solutions include mounting a test ROM in the test system fixture or programming the test system to intercept signals from the CPU for a particular address and then substitute the appropriate instructions from the test program. These test approaches require access to system status information or a very sophisticated expensive test system or both.

SUMMARY

In accordance with the preferred embodiment of the present invention, an apparatus and method are described for transferring data into an integrated circuit. The apparatus comprises a low power supply detection unit, a serial-to-parallel converter unit and a control unit. The low power supply detection unit is used to demodulate the power supply line to generate a serial bit stream. The bit stream is then converted to parallel data using any of several well known techniques including FM, MFM, and NRZ. The logic control unit disposes of the data as desired by the designer.

Such an apparatus and method may be used, among other things, to transfer a program into RAM which may be used to test a product. In this case, the apparatus is included along with the typical storage array and decode circuitry to form a RAM. A test system may then modulate the power supply voltage of the system under test to load the program. The program then performs the manufacturing test on the system.

The primary object of the present invention, therefore, is to provide a means for transferring data into a device without dedicating a pin of the integrated circuit or other separate input line in the device for the purpose.

Another object of the present invention, is to add the least amount of circuitry to the system device employing the method and apparatus.

A further object of the present invention is to permit economical testing of a system.

DESCRIPTION OF THE PREFERRED EMBODIMENT

Figure 1:
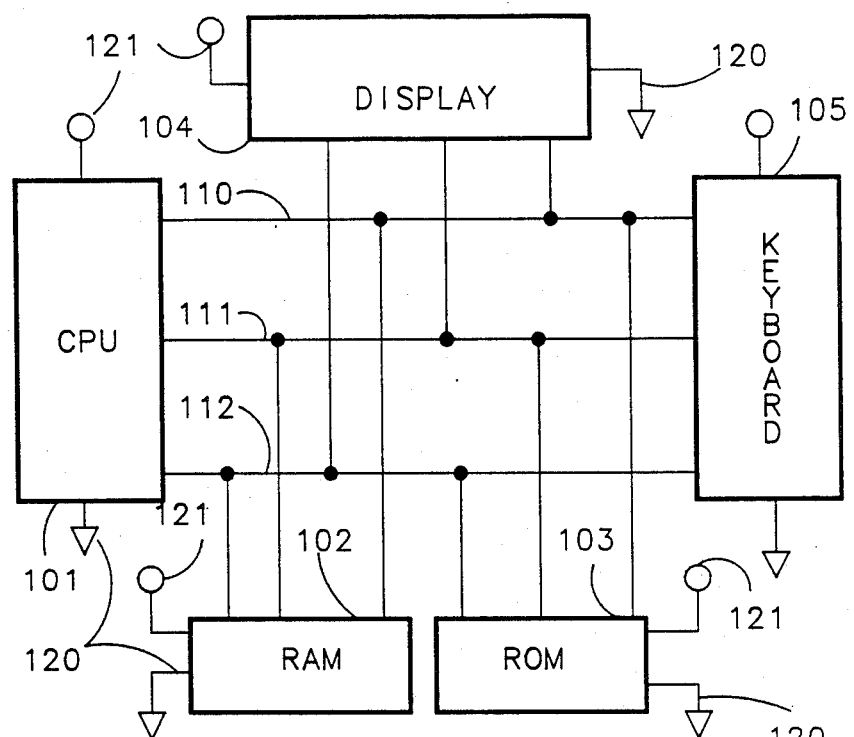
FIG. 1 is a functional block diagram of a computer system employing the method and apparatus of the present invention.

FIG. 1 is a functional block diagram of a computer system employing the method and apparatus of the present invention. The system comprises a central processing unit (CPU) 101, RAM 102, ROM 103, display 104 and keyboard 105, collectively known as system devices. Communication between the system devices is provided on data bus 110, address bus 111 and control bus 112. The CPU is capable of executing code located in either ROM 103 or RAM 102. Power is supplied to each of the system devices by voltage supply line 121 and ground line 120. All the system devices are located on a single system card. In order to test the computer system, the system card is placed on a test fixture and the test program is loaded into the RAM and executed. As the program is executed by the CPU 101, the results are displayed on the display 104.

Figure 2:
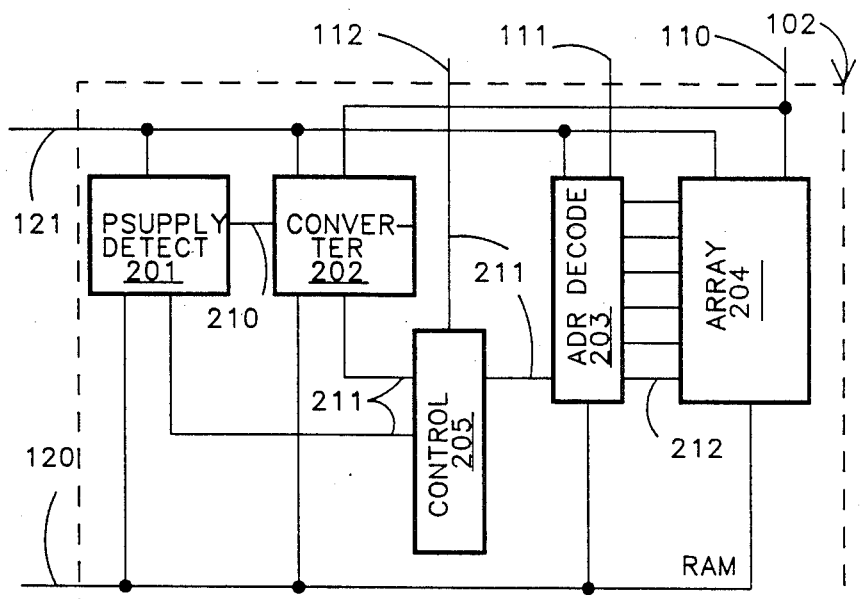
FIG. 2 is a functional block diagram of a RAM device in accordance with the preferred embodiment of the present invention.

FIG. 2 is a functional block diagram of a RAM device in accordance with the preferred embodiment of the present invention. The RAM 102 has two power supply lines, voltage supply line 121 and ground line 120. These supply lines supply the power to each of the functional units located in the RAM. The RAM 102 comprises a low power supply detection unit 201, serial-to-parallel converter unit 202, control unit 205, address decode unit 203 and storage array 204. The low power supply detection unit 201 is connected between the power supply lines 120 and 121. The unit 201 generates a stream of logic bits from variations in the voltage across the power supply lines. The bit stream is then supplied to the serial-to-parallel converter unit 202. The serial-to-parallel converter unit 202 can use any of the available serial-to-parallel encoding techniques including biphase, FM, MFM, NRZ. The enclodiing technique may or may not be self clocking.

After the bit stream has been converted into parallel data, the control logic 105 transfers the data to the storage array 204 over data bus 110. Normal operation of the RAM is performed by supplying an address to be read or written on the address bus 111. According to the control signals provided on control bus 112, data is then either read from the data bus 110 or supplied to the data bus 110 by the storage array 204. The address bus 111, data bus 110 and control bus 112 may be implemented as serial or parallel busses and may be multiplexed according to the wishes of the designer.

In an alternate embodiment of the present invention, the CPU 101 performs the serial-to-parallel conversion under control of software. The CPU 101 executes a program contained in ROM 103 which repeatedly scans the output from the low power supply detection unit 201 to receive each bit of information, assembles the bits into the data, and stores the information in RAM 102. In the preferred embodiment of the present invention, an asynchronous NRZ technique is employed which is similar to RS-232.

Figure 3:
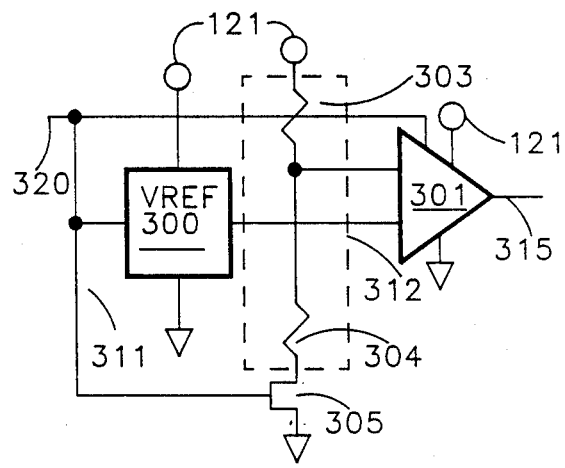
FIG. 3 is a low power supply detection unit in accordance with the preferred embodiment of the present invention.

FIG. 3 is a low power supply detection unit in accordance with the preferred embodiment of the present invention. The circuit comprises voltage reference 300, a voltage divider 312, switch 305 and comparator 301. The voltage divider 312 comprises resistors 303 and 304. A power control signal 320 disables the voltage reference 300 and comparator 301 in order to save power when they are not in use. This function is optional. The voltage reference 300 generates a reference voltage independent of the voltage on supply line 121. This reference voltage serves as the low voltage threshold for determining when, for example, the batteries in the system need to be replaced. A voltage divider comprising resistors 304 and 303 also generates a reference voltage, however this voltage is related to the voltage across the power supply lines 121 and 120. The voltage divider may be disabled by switch 305 under control of power control signal 320 in order to conserve power. The reference voltages from the voltage divider 312 and from the voltage reference 300 are compared by comparator 301 which generates an output signal 315. The output signal 315 is logic false when the voltage supply line 121 is above the low voltage threshold and logic true when the voltage supply line 121 is below the low voltage threshold.

Figure 4:
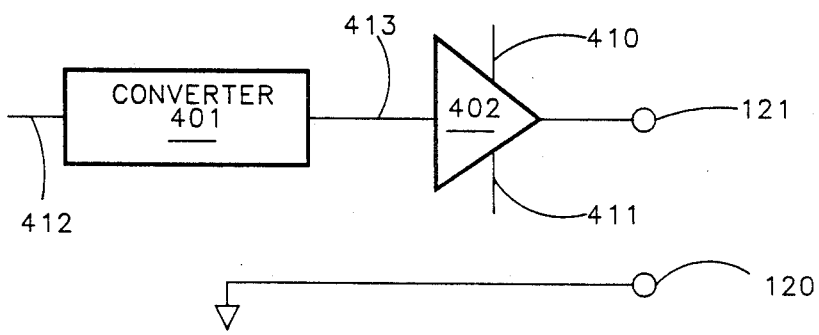
FIG. 4 is a functional block diagram of a test system compatible with the preferred embodiment of the present invention.

FIG. 4 is a functional block diagram of a test system compatible with the preferred embodiment of the present invention. The circuit comprises a parallel-to-serial converter 401 and a driver 402. The parallel-to-serial converter 401 generates a bit stream from data supplied to it over bus 412 using an encoding technique which is compatible with the techniques employed in the system under test. The driver 402 modulates the power supply voltage with the bit stream generated by the parallel-to-serial converter 401. The driver 402 acts as the power supply for the system under test and modulates the power supply voltage by switching between two voltage levels 410 and 411, both of which are within the range of acceptable power supply voltages, in response to the true and false logic levels of the bit stream. Voltage level 410 is greater than the low voltage threshold determined by the voltage reference 300 of the low power detection unit 201 and the voltage level 411 is less than the low voltage threshold. The output of the drive is fed to the voltage supply line of the system under test.

The operation of the preferred embodiment when employed in a test system is as follows. The test program located in the memory of the test system is fed down the parallel bus 412 to the parallel-to-serial converter 401. The parallel-to-serial converter encodes the program to generate a bit stream which is send to the driver 402. The driver 402 modulates the voltage supply line 121 based on the bit stream. The modulated power supply lines are fed to the system under test. Since each system device in the system is designed to operate with a varying voltage supply, the operation of the system is unaffected by the fluctuations in voltage of the power supply lines. The CPU 101 periodically activates the low power supply detection unit 201 until the CPU recognizes that data is ready to be loaded. The low power supply detection unit 201 translates the modulated voltage on the power supply lines 121 and 120 into a bit stream which is converted into a series of parallel bytes by the serial-to-parallel converter 202. This data is stored in the storage array 204 under the control of control unit 105. The CPU 101 waits for the loading process to be completed and then executes the test code just loaded thereby performing the manufacturing test. The results of the test are displayed on the display 104. A low power supply condition may be discovered using the low power detection unit 201 when the voltage of the power supply line is below the low voltage threshold for a period of time longer than permitted by the encoding technique.

Although the preferred embodiment of the present invention is implemented as a RAM, the method and apparatus disclosed herein is equally appliable to testing any of the system devices, for example, the CPU 101 and ROM 103 or any other electronic device with a power supply input. The method and apparatus of the present invention are not limited to use in device testing. The method and apparatus may generally be used to transfer information, including programs, data and control into electronic systems. For example, the method and apparatus could be used to program an EPROM in a system by transferring data into the EPROM on the power supply and then raising the supply voltage to program the EPROM. The method and apparatus may also be used to transfer information including programs, data and control into a device during normal operation. Furthermore, the method and apparatus are compatible with battery operation and AC line operation. Additional applications of the present invention are readily apparent to those skilled in the art.

I claim:

1. An apparatus for transferring information in an electronic system, having one or more electronic devices, the apparatus comprising:

power supply means having power supply lines for supplying power at a voloage to the devices of the electronic system through the power supply lines, wherein the voltage varies between a first and second predetermined voltage level,
  wherein both voltage levels are suitable for proper operation of the devices, and
  wherein the voltage is varied in response to the information to be transferred to the devices;
  detecting means connected to the power supply lines for detecting the variations in the voltage across the power supply lines and generating a signal indicating the voltage is at the first voltage level or the second voltage level, wherein the detecting means receives its power from the power supply lines;
  translating means connected to the detecting means for translating the signal indciating the voltage is at the first or second voltage level into information, wherein the translating means receives its power from the power supply lines; and
  control means connected to the translating means for controlling the translating means, wherein the the control means receives its power from the power supply lines.

2. An apparatus as in claim 1 further comprising means for disabling the detection and translation means under the control of the control means.

3. An apparatus as in claim 1 wherein the power supply means further comprises:
  an unregulated power supply;
  serializing means for serializing the information into a stream of bits; and
  regulating means connected to the serializing means, the power supply lines and unregulated power supply for varying the voltage across the power supply lines between the first and second voltage level in response to the stream of bits.

4. An apparatus as in claim 3 wherein the translating means comprises means for translating a serial bit stream into the information.

5. A method for transferring information into an electronic system, having one or more electronic devices, the electronic system having power supply inputs connected to a power supply, the method comprising:
  converting the information into variations in the voltage of the power supply, the variations being between a first and second voltage level, both voltage levels being suitable for proper operation of the device, while supplying power to the electronic system through the power supply inputs;
  detecting the variations in the voltage across the power supply inputs and
  translating the variations in the voltage of the power supply into information.

6. A method as in claim 5 wherein the step of converting the information into variations in voltage further comprises:
  serializing the information into a stream of bits; and
  modulating the power supply between the first and second voltage level in response to the stream of bits.

7. A method as in claim 6 wherein the step of serializing the information consists of encoding the information into the bit stream by employing a method selected from the group consisting of biphase, FM, MFM and NRZ.

8. A method as in claim 5 wherein translating the variations in the power supply into information further comprises converting a serial bit stream into the information.

9. A method for loading a test program into program storage of an electronic system, having one or more electronic devices, which is under test, the electronic system having power supply inputs connected to a power supply, the method comprising:
  serializing the test program into a stream of bits;
  modulating the voltage of the power supply connected to the power supply inputs of the system under test between a first and second voltage level in response to the stream of bits, both voltage levels being suitable for proper operation of the device;
  detecting variations in the voltage across the power supply inputs;
  translating the variations in the voltage of the power supply into the test program; and 10. An apparatus for receiving information contained in variations in voltage of the power supply connected to the power supply lines of an electronic system, having one or more electronic devices, while receiving power on the power supply lines, the apparatus comprising:
  detecting means connected to the power supply lines for detecting the variations in the voltage across the power supply lines and generating a signal indicating the voltage is at the first voltage level or the second voltage level, wherein the detecting means receives its power from the power supply lines;
  translating means connected to the detecting means for translating the signal indicating the voltage is at the first or second voltage level into information, wherein the translating means receives its power from the power supply lines; and
  control means connected to the translating means for controlling the translating means, wherein the control means receives its power from the power supply lines.

11. An apparatus as in claim 10 further comprising means for disabling the detection and translation means under the control of the control means.

12. An apparatus for sending information through the power supply inputs of an electronic system, having one or more electronic devices, while supplying power the system, the apparatus comprising:
  serializing means for generating a stream of bits from the information; and
  modulating means connected to the serializing means for varying the voltage of the power supply between a first and second voltage level in response to the stream of bits, both voltage levels being suitable for proper operation of the evice while supplying power to the electronic system

* * * * *